(12) United States Patent
Mori

(10) Patent No.: US 7,486,090 B2
(45) Date of Patent: Feb. 3, 2009

(54) TESTING DEVICE

(75) Inventor: Yasuo Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/118,221

(22) Filed: May 9, 2008

(65) Prior Publication Data

US 2008/0218190 A1   Sep. 11, 2008

Related U.S. Application Data

(63) Continuation of application No. 11/353,248, filed on Feb. 14, 2006, now Pat. No. 7,342,358.

(30) Foreign Application Priority Data

Mar. 23, 2006   (JP) ............................. 2006-081653

(51) Int. Cl.
*G01R 31/02* (2006.01)
(52) U.S. Cl. ..................................... 324/758
(58) Field of Classification Search ............. 324/158.1, 324/755–765, 207.27; 73/493, 514.31; 341/5, 341/15, 20
See application file for complete search history.

(56) References Cited

U.S. PATENT DOCUMENTS

| 5,456,001 | A | 10/1995 | Mori et al. |
| 5,982,182 | A | 11/1999 | Chiu et al. |
| 6,472,864 | B1 | 10/2002 | Emo et al. |
| 6,768,964 | B2 * | 7/2004 | Souda .................. 702/150 |
| 6,822,464 | B2 * | 11/2004 | Suzuki .................. 324/754 |

FOREIGN PATENT DOCUMENTS

JP   2004-234837   8/2004

OTHER PUBLICATIONS

U.S. Appl. No. 11/289,452, filed Nov. 30, 2005, Susumu Miyazawa.

* cited by examiner

*Primary Examiner*—Ha Tran T Nguyen
*Assistant Examiner*—Trung Q Nguyen
(74) *Attorney, Agent, or Firm*—Staas & Halsey LLP

(57) ABSTRACT

A printed-circuit-board testing device that tests an electronic component disposed on a printed circuit board includes printed-circuit-board-tilt measuring means for measuring tilting of the printed circuit board, measuring means for measuring tilting of an arm having a probe that comes into contact with and tests the electronic component, correcting means for correcting the tilting of the arm on the basis of the tilting of the printed circuit board and the tilting of the arm, inputting means for inputting positional information of the electronic component, arm disposing means for disposing the arm to a predetermined position in accordance with the positional information and printed-circuit-board testing means for performing testing as a result of protruding the probe from the disposed arm.

2 Claims, 21 Drawing Sheets

TESTING DEVICE

CROSS-REFERENCE TO RELATED APPLICATIONS

The present application is a Continuation of application Ser. No. 11/353,248,now U.S. Pat. No.7,342,358, and claims the benefit based on Japanese Priority Application No. 2006-081653 filed on Mar. 23, 2006 with the Japanese Patent Office, the entire contents of which are hereby incorporated by reference.

BACKGROUND OF THE INVENTION

1. Field of the Invention

The present invention relates to a test that is performed by causing a simulated failure to occur at a printed circuit board mounted to an information processor.

2. Description of the Related Art

Hitherto, testing of an information processor has been performed by causing a simulated failure to occur as a result of bringing a probe into contact with, for example, a predetermined component on a printed circuit board mounted to the information processor. Many information processors have a plurality of printed circuit boards mounted thereto in the form of layers. The probe is inserted between printed circuit boards to bring the probe into contact with, for example, components on the printed circuit boards.

However, since the probe that is inserted between the printed circuit boards has a long lead wire, an evaluation test of the information processor cannot be efficiently carried out.

Accordingly, a printed-circuit-board testing device for efficiently performing an evaluation test of an information processor is disclosed in Japanese Patent Application No. 2004-234837. The printed-circuit-board testing device according to this document performs tests on printed circuit boards, which are mounted to the information processor in the form of layers, by efficiently causing a simulated failure to occur at the printed circuit boards. A guide panel for establishing ground is disposed between the printed circuit boards. An arm having a probe is inserted between the printed circuit board to be tested and the guide panel. The test is performed by causing a simulated failure to occur as a result of bringing the probe into contact with a predetermined via hole and/or land of the printed circuit board and establishing ground with respect to the guide panel.

The testing device disclosed in Japanese Patent Application No. 2004-234837 performs testing by controlling the position of the probe on the basis of positional information of the predetermined via hole and/or land.

FIG. 1 is a conceptual diagram related to testing of a printed circuit board in a related art.

Electronic components 108, 109, 110, and 111 are mounted to a printed circuit board 103. A land 105 is also provided on the printed circuit board 103. A probe is brought into contact with the land 105 to cause a simulated failure to occur. The probe is provided at an arm 101 so that it can protrude from the arm 101.

After positioning the arm 101 on the basis of positional information of the land 105, the probe protrudes from the arm 101 and comes into contact with the land 105. When the probe comes into contact with the land 105, a coma, disposed at a surface of the arm 101 that is opposite to the surface of the arm 101 from which the probe protrudes, is grounded to a guide panel 104 due to reaction pressure that is generated when the probe contacts the land 105, so that a simulated failure occurs.

Here, the probe and the coma are not illustrated, and the printed circuit board 103 is parallel to the guide panel 104.

When a printed circuit board is to be tested, ideally, the arm 101 is parallel to the printed circuit board 103.

However, the arm 102 is not parallel to the printed circuit board 103. When a tilt angle θ106 exists between the arm 102 and the printed circuit board 103, an error δ107 is occurs. This prevents the probe from precisely contacting the land 105. Therefore, the testing that is performed by precisely causing a simulated failure to occur cannot be reliably performed.

To precisely perform the testing of the printed circuit board 103, the tilt angle θ106 between the arm 102 and the printed circuit board 103 needs to be brought as close as possible to zero.

At present, the printed circuit board 103 and the arm 102 are visually brought parallel to each other, so that considerable time is used to bring the printed circuit board 103 and the arm 102 parallel to each other.

SUMMARY OF THE INVENTION

Accordingly, the present invention makes it possible to efficiently test a printed circuit board 103 in a short time by reliably causing a simulated failure to occur as a result of setting the printed circuit board 103 and an arm 102 parallel to each other and bringing an error δ107 as close as possible to zero.

According to an aspect of the present invention, a printed-circuit-board testing device that tests an electronic component disposed on a printed circuit board includes printed-circuit-board-tilt measuring means for measuring tilting of the printed circuit board, arm-tilt measuring means for measuring tilting of an arm having a probe that comes into contact with and tests the electronic component, arm-tilt correcting means for correcting the tilting of the arm on the basis of the tilting of the printed circuit board and the tilting of the arm, position-information inputting means for inputting positional information of the electronic component, arm disposing means for disposing the arm to a predetermined position in accordance with the positional information, and printed-circuit-board testing means for performing testing by causing a simulated failure to occur as a result of protruding the probe from the disposed arm and bringing the probe into contact with the electronic component.

According to the present invention, it is possible to efficiently adjust a tilt angle between a printed circuit board and an arm, and to reliably test the printed circuit board in a short time.

DETAILED DESCRIPTION OF THE PREFERRED EMBODIMENTS

Figure 1:
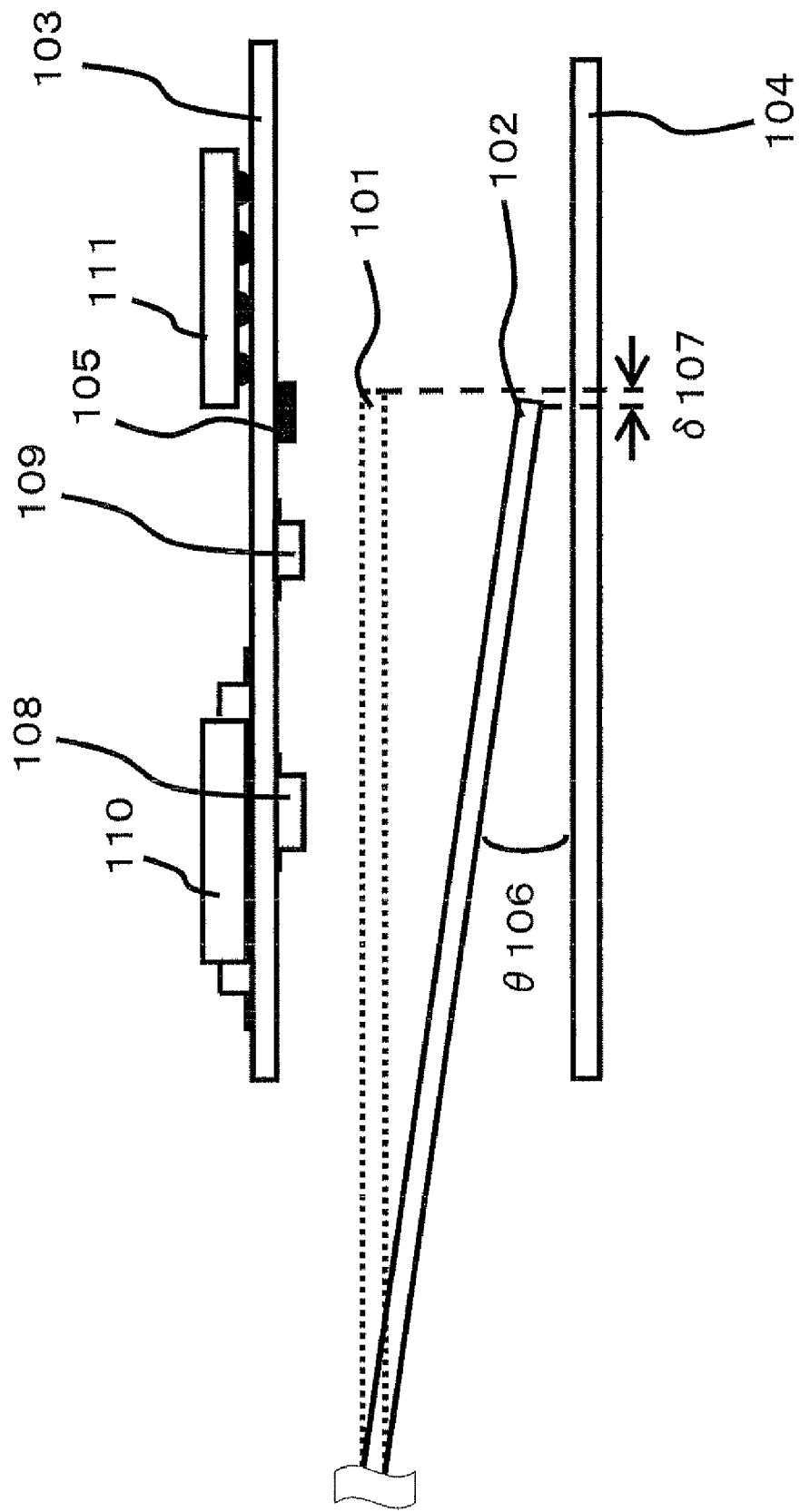
FIG. 1 is a conceptual diagram related to testing of a printed circuit board in a related art.

This application is related to and claims the benefit of U.S. patent application Ser. No. 11/289,452, filed Nov. 24, 2005, in US, the disclosure of which is incorporated herein by reference. In the U.S. patent application Ser. No. 11/289,452, FIG. 1 shows a basic structure of testing device to test a function of an information processing apparatus. A printed-circuit-board testing device in FIG. 19 has the equivalent of functions included the testing device in U.S. patent application Ser. No. 11/289,452.

Figure 19:
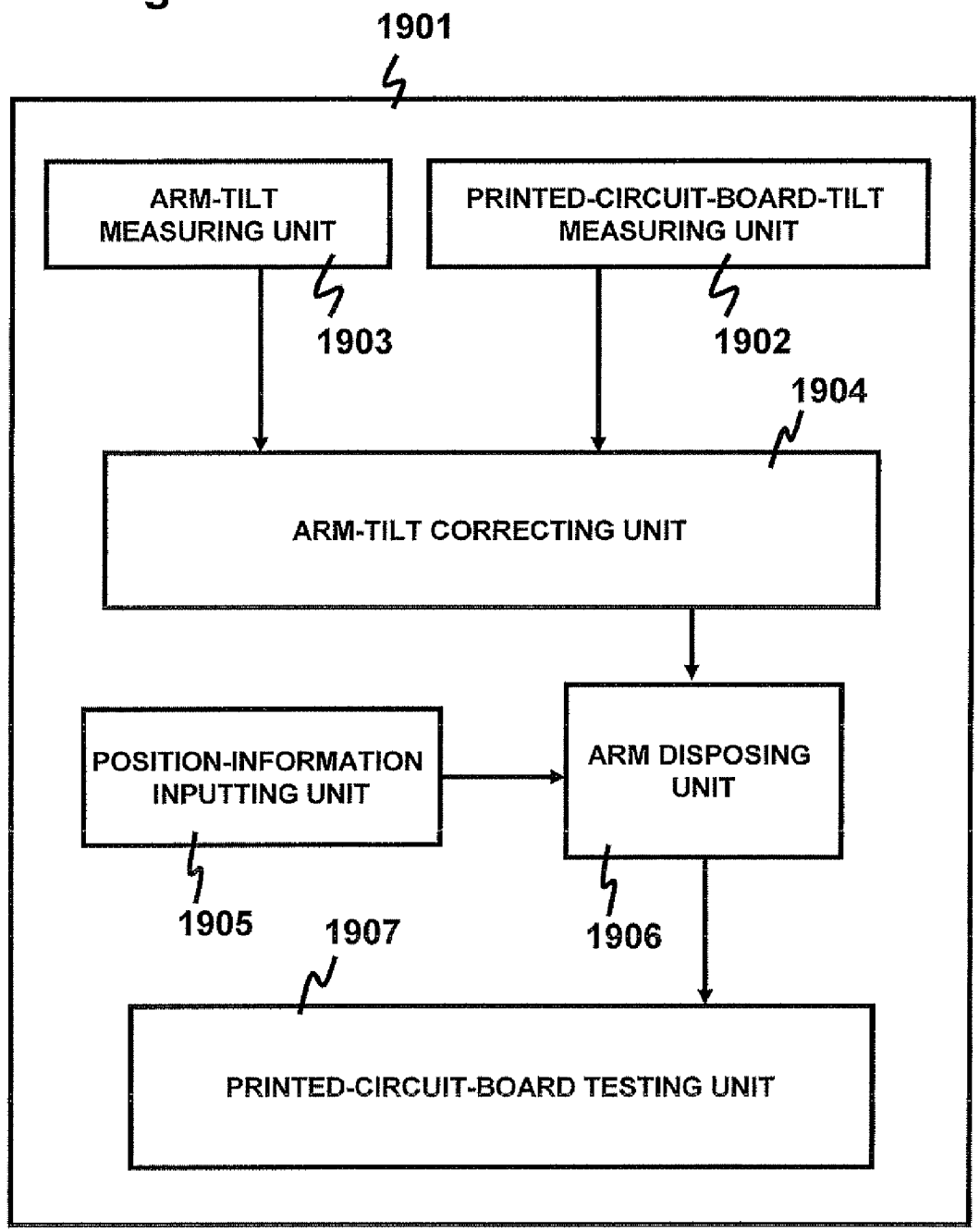
FIG. 19 is a block diagram of a printed-circuit-board testing device 1901 according to an embodiment according to an embodiment of the present invention.

FIG. 19 is a block diagram of a printed-circuit-board testing device 1901 according to an embodiment.

The printed-circuit-board testing device 1901 comprises printed-circuit-board-tilt measuring unit 1902, arm-tilt measuring unit 1903, arm-tilt correcting unit 1904, position-information inputting unit 1905, arm disposing unit 1906, and printed-circuit-board testing unit 1907.

The printed-circuit-board-tilt measuring unit 1902 measures relative tilting of a printed circuit board, and the arm-tilt measuring unit 1903 measures relative tilting of an arm. In the embodiment, the relative tilting of the printed circuit board and the relative tilting of the arm are stored in the arm-tilt correcting unit 1904 as tilt information of the printed circuit board and as tilt information of the arm, respectively.

The arm-tilt correcting unit 1904 refers to the tilt information of the printed circuit board and the tilt information of the arm, and corrects the tilting of the arm. When the arm-tilt correcting unit 1904 determines that the tilt information of the printed circuit board and the tilt information of the arm are not the same, the arm-tilt correcting unit 1904 calculates correction information for making the same the tilt information of the printed circuit board and the tilt information of the arm, to correct the tilting of the arm on the basis of the correction information and to end the correction operation of the tilting of the arm. In contrast, when the arm-tilt correcting unit 1904 determines that the tilt information of the printed circuit board and the tilt information of the arm are the same, the arm-tilt correcting unit 1904 ends the correction operation of the tilting of the arm without changing the tilt of the arm. In the embodiment, after calculating the correction information, the arm-tilt correcting unit 1904 deletes the tilt information of the printed circuit board and the tilt information of the arm that were stored in the arm-tilt correcting unit 1904.

The arm disposing unit 1906 that has received a notification from the arm-tilt correcting unit 1904 that the correction of the tilting of the arm has ended sets the printed-circuit-board testing device 1901 to a reference position.

Using the position information inputting unit 1905, a tester who executes a test inputs information regarding the position of a via hole and/or a land to be tested. The arm disposing unit 1906 receives the information regarding the position of the via hole and/or the land from the position information inputting unit 1905, and disposes the arm to a predetermined position.

Here, the structure may be such that these pieces of positional information are previously stored in, for example, a storage unit (not shown), and are called out by the arm disposing unit 1906 when necessary. Alternatively, the structure may be such that the tester disposes the printed-circuit-board testing device 1901 to the reference position.

The printed-circuit-board testing unit 1907 tests the printed circuit board by causing a simulated failure to occur as a result of making a probe protrude from the disposed arm and bringing the probe into contact with the via hole and/or the land.

After testing the printed circuit board, if an error is detected in a test result, for example, an electronic component in which an error has occurred is repaired. Here, if an error is detected in the test result, for example, the electronic component in which an error has occurred or the entire printed circuit board may be discarded.

Figure 9:
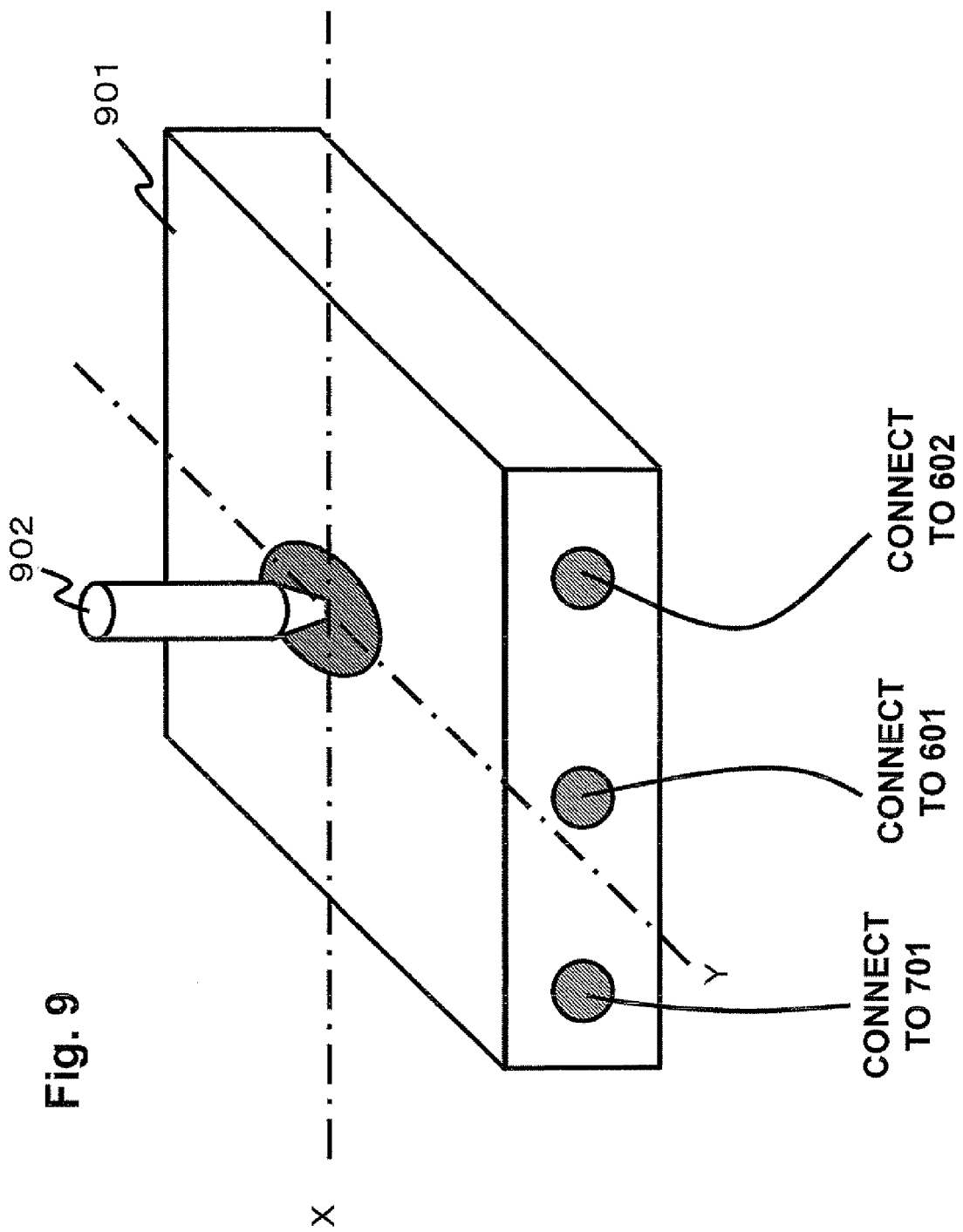
FIG. 9 is a schematic view of an operating unit 901 according to an embodiment of the present invention.

After the printed-circuit-board-tilt measuring unit 1902 has measured the relative tilting of the printed circuit board and the arm-tilt measuring unit 1903 has measured the relative tilting of the arm, the tester may correct the tilting of the arm by using an operating unit 901 shown in FIG. 9. In this case, the tilt information of the printed circuit board and the tilt information of the arm are stored in the printed-circuit-board-tilt measuring unit 1902 and the arm-tilt measuring unit 1903. The tester refers to the tilt information of the printed circuit board and the tilt information of the arm to correct the tilting of the arm with the operating unit 901.

Figure 4:
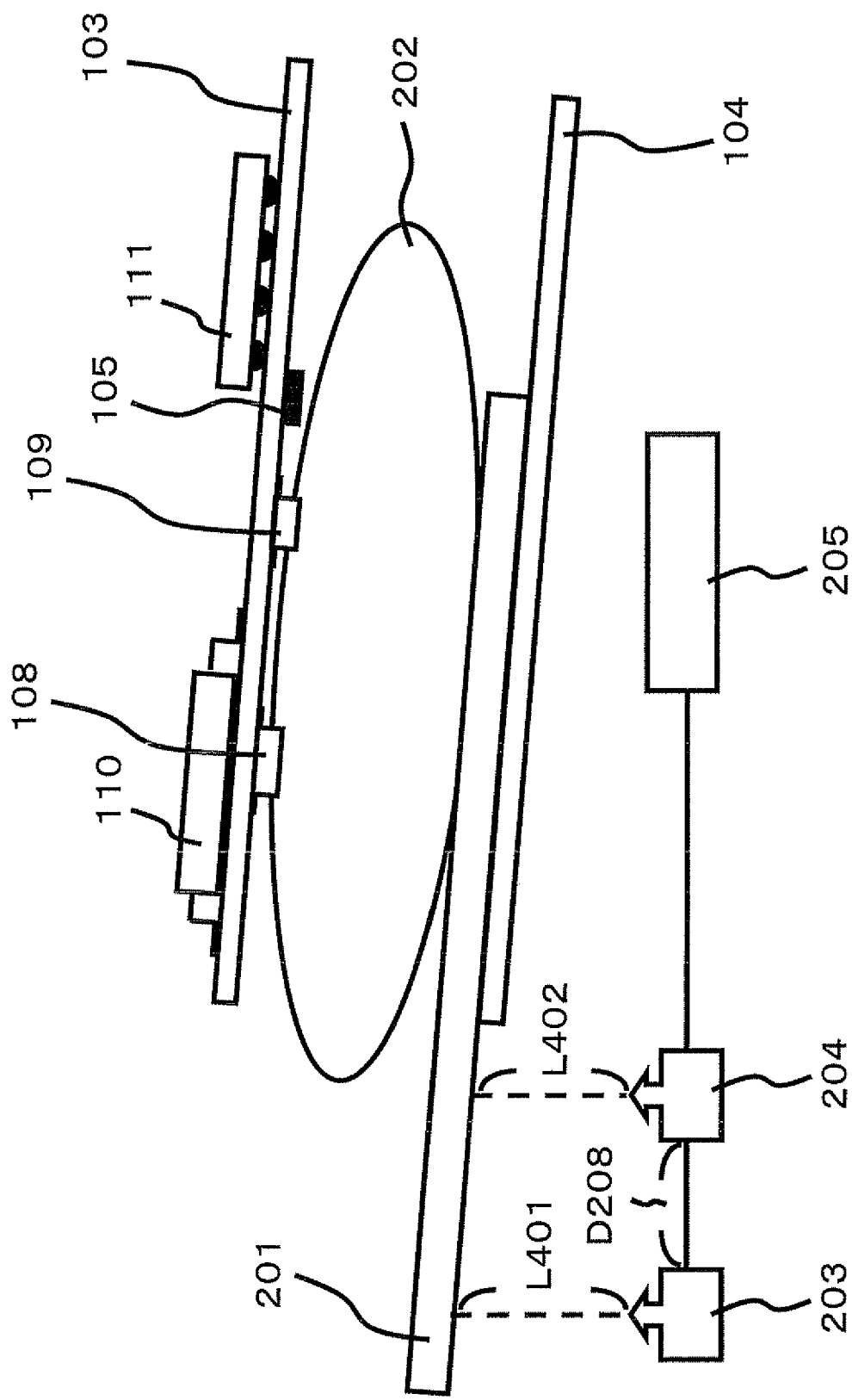
FIG. 4 is a conceptual diagram related to measuring the tilting of the printed circuit board 103 according to an embodiment of the present invention.
Figure 21A:
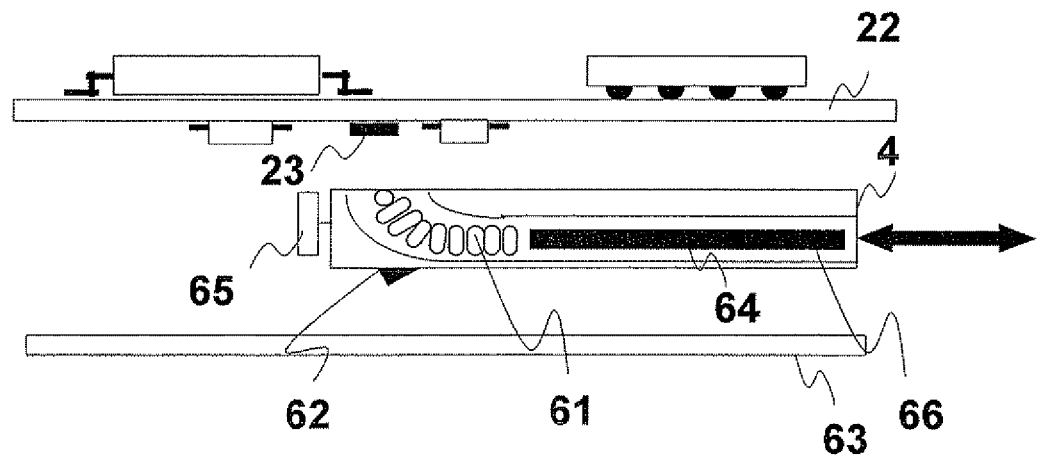
FIGS. 21A and 21B are conceptual diagram of a probe and a probe tip grounding means according to an embodiment of the present invention.

FIG. 4 shows in detail an embodiment of the probe 4 and an example of the probe tip 61, which are used in the testing device 1 according to the present invention. As shown in FIG. 21A showing a state prior to the pushing-out of the probe tip 61, a grounded guide panel 63 and the probe 4 are inserted in a gap between the printed circuit board 22 to be tested and the guide panel 63 adjacent thereto. Here, the adjacent printed circuit board is usually disposed below the guide panel 63. The body of the probe 4 is formed of an insulating material, such as zirconia. The probe 4 is positioned so that the probe tip 61 is adjusted above or below a predetermined via hole and/or land 23. The guide panel 63 may be formed so as to be mountable to the printed circuit board 22. For example, the four corners of the printed circuit board 22 and the four corners of the guide panel 63 are secured with a gap having a size which allows testing by insertion of the probe 4 being formed there between, and the guide panel 63 is removed from the printed circuit board 22 after the testing.

Figure 21B:
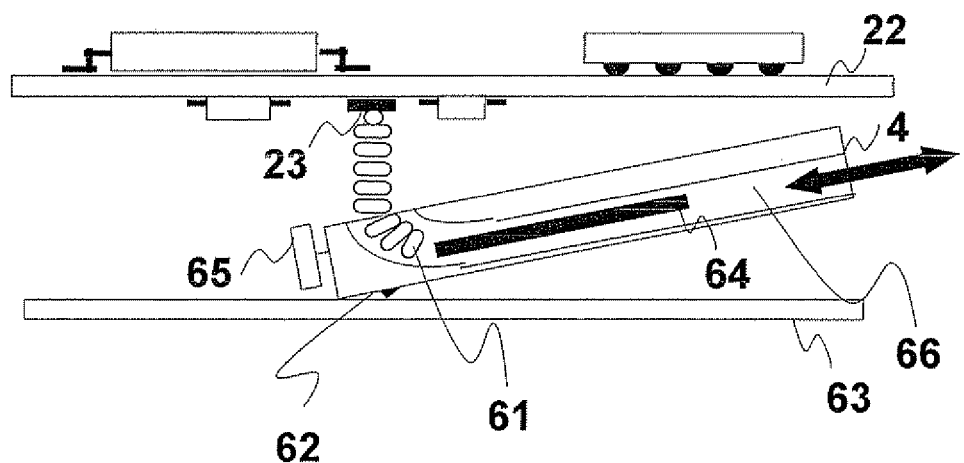

After completing the positioning, as shown in FIG. 21B showing a state after the pushing-out of the probe tip, the probe tip grounding means pushes the electrically conductive probe tip 61 incorporated in the probe 4 towards the via hole and/or the land 23 and causes the probe tip 61 to come into contact therewith. The probe tip 61 has a spring structure and is pushed out by a rod 64 and projects from the surface of the probe. The probe 4 has a storing unit 66, where the probe tip 61 and the rod 64 are disposed.

The length of the probe tip 61 is longer than the sum of the size of a gap between the probe 4 and the printed circuit board 22 to be tested and the size of a gap between the probe 4 and the guide panel 63. The probe 4 is flexed by reaction with respect to the pushing out of the probe tip 61 towards the via hole and/or the land 23, so that a top-like portion 62, disposed at a back side of the probe and electrically connected to the probe tip 61, comes into contact with the guide panel 63 to thereby ground the probe tip 61.

The probe tip detects an actual output information from the via hole and/or the land 23 and transmit the actual output information to the error detecting means 34. If the correct output information and the actual output information are the same in the error detecting means 34, then the guide panel 63 is to be grounded. As a result, a simulated failure is caused by grounded the guide panel 63 because the probe tip 61 is electrically connected with top-like portion 62. On the other hand, if the correct output information and the actual output information are not the same in the error detecting means 34, guide panel 63 is not grounded and also probe tip 61 is not grounded. Since the probe tip 61 has a spring structure, the probe tip 61 can be easily incorporated in the probe 4 and can be smoothly pushed out from the probe 4. The operation of the rod 64 is controlled with the probe tip pushing-out means 6.

The printed-circuit-board testing device 1901 further comprises probe tip over current detecting means. When an over current is detected when the probe tip 61 has been grounded, the grounding of the probe tip 61 is halted and an over current error is output.

The printed-circuit-board testing device 1901 further comprises probe tip open detecting means. When an open is detected when the probe tip 61 has been grounded, an open error is output.

The probe positioning means further comprises collision controlling means. When a collision is detected with a collision sensor 65 of the probe 4, the movement of the probe 4 is halted.

Figure 2:
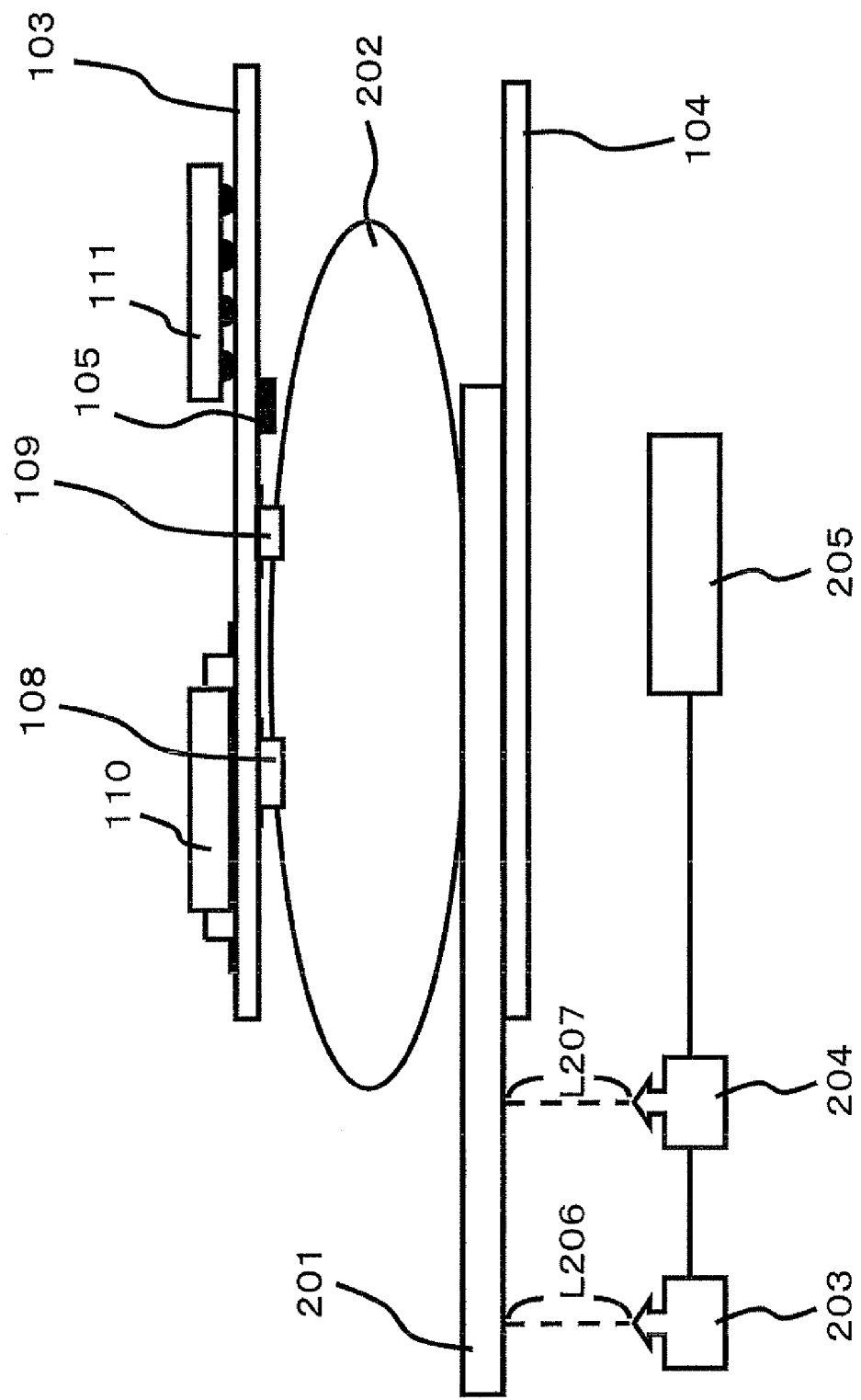
FIG. 2 is a conceptual diagram related to measuring tilting of a printed circuit board 103 according to an embodiment of the present invention.

FIG. 2 is a conceptual diagram related to measuring tilting of a printed circuit board 103.

When the printed circuit board is to be tested, the tilting of the printed circuit board is measured. To achieve this, a measuring bar 201 is disposed between the printed circuit board 103 and a guide panel 104. The measuring bar 201 is disposed in contact with a surface of the guide panel 104 facing the printed circuit board 103, and protrudes from a gap between the printed circuit board 103 and the guide panel 104. To secure the measuring bar 201, a balloon 202 is disposed between the printed circuit board 103 and the guide panel 104. The balloon 202 is filled with air, and secures the measuring bar 201 as a result of pushing the measuring bar 201 against the guide panel 104.

The tester disposes distance measuring units 203 and 204 apart from each other by a predetermined distance D208 below the protruding portion of the measuring bar 201. More specifically, for example, the tester sets the distance D208 between the distance measuring units 203 and 204 at 10 cm.

The distance measuring units 203 and 204 measure their respective distances L206 and L207 from the measuring bar 201. The distance measuring units 203 and 204 are connected to a controller 205. The controller 205 calculates the difference between the distances L206 and L207, and sends the calculated difference between the distances L206 and L207 to the arm-tilt correcting unit 1904. In the embodiment, the calculated difference that the controller 205 sends to the arm-tilt correcting unit 1904 is determined by subtracting the distance L207 from the distance L206 (L206–L207).

In the embodiment, the distance measuring units 203 and 204 measure their respective distances L206 and 207 by the following method. The distance measuring units 203 and 204 each comprise a light emitter that emits light that strikes the measuring bar 201, a light receiver that receives the light reflected by the measuring bar, and a time measuring unit that measures the time required for the light emitted from the light emitter to be received by the receiver. Each light emitter emits light, and each light receiver receives the light reflected by the measuring bar. Each time measuring unit measures the time required for the light emitted from the light emitter to be received by its corresponding light receiver, so that the distances L206 and 207 are calculated on the basis of the measured times.

In the embodiment, the printed-circuit-board-tilt measuring unit 1902 and the arm-tilt measuring unit 1903 are the same in terms of hardware, and comprise the respective distance measuring units 203 and 204 and the controller 205.

Figure 15:
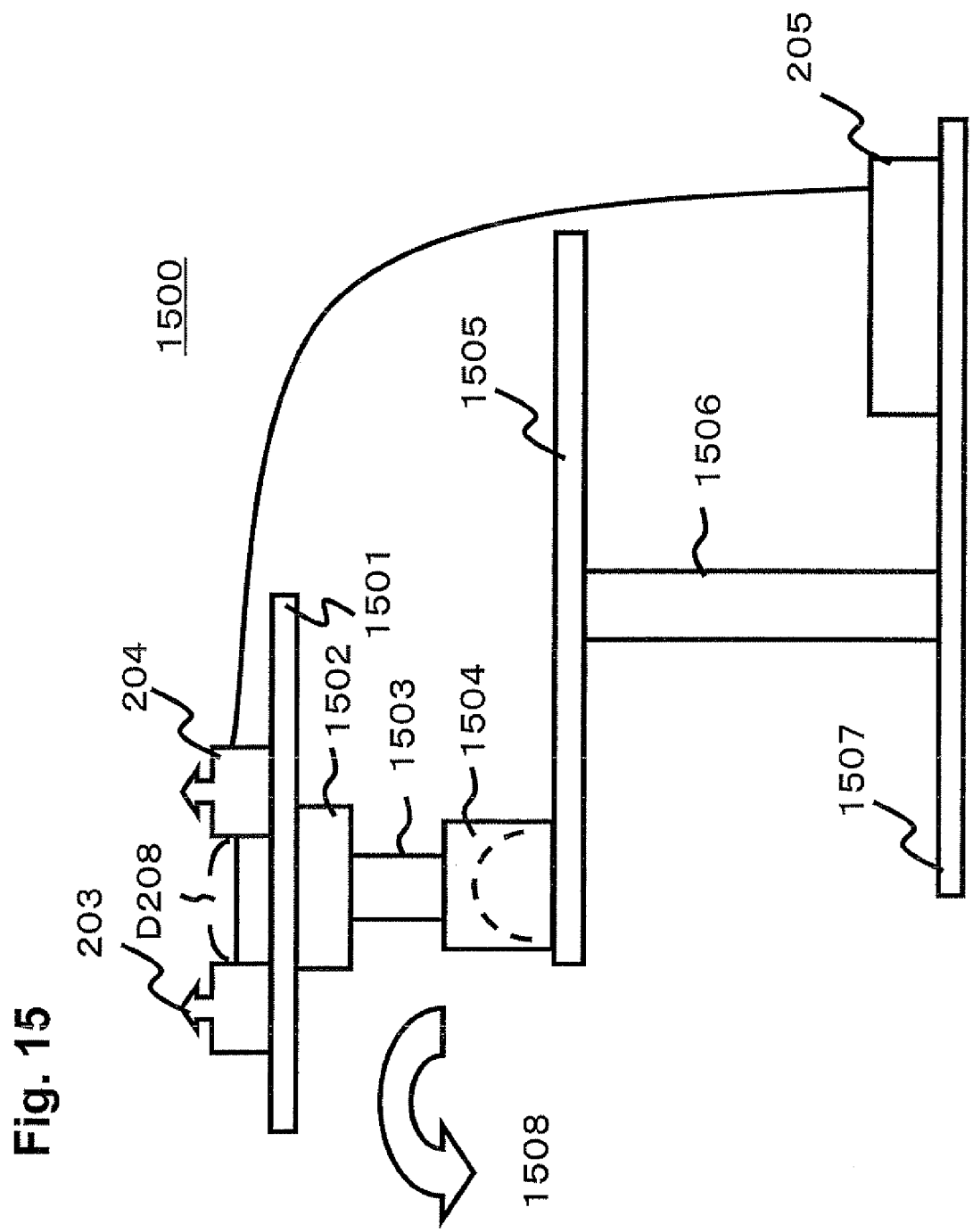
FIG. 15 is a schematic view of a tilt measuring device 1500 according to an embodiment of the present invention.

The distance measuring units 203 and 204 are disposed on a distance-measuring-unit securing plate 1501 (shown in FIG. 15). When the distance-measuring-unit securing plate 1501 and the measuring bar 201 are parallel to each other, the difference between the distances L206 and L207 (L206–L207) is zero. However, when the distance-measuring-unit securing plate 1501 and the measuring bar 201 are not parallel to each other, for example, in FIG. 4, the difference between a distance L401 and a distance L402 (L401–L402) is not zero.

Figure 3:
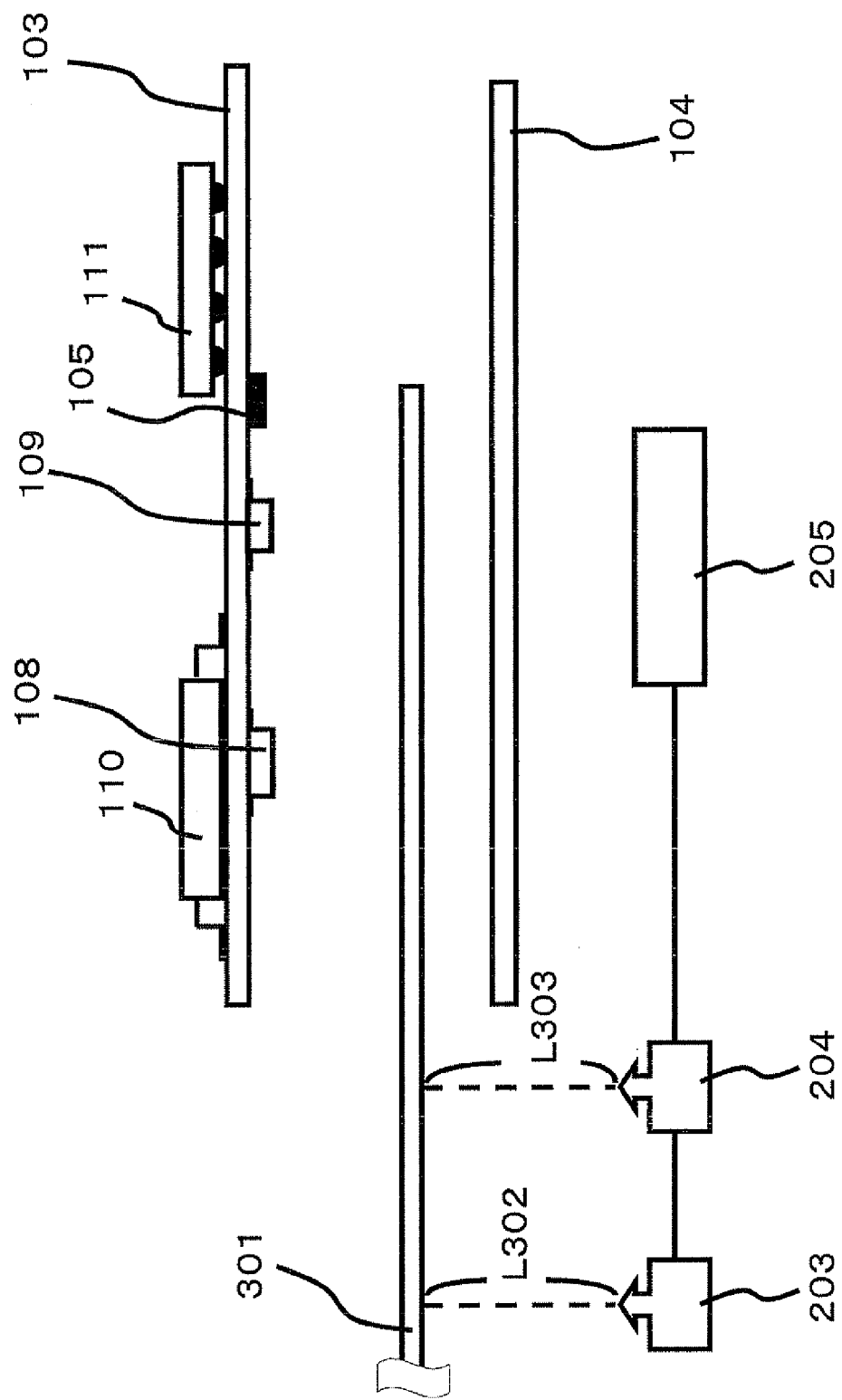
FIG. 3 is a conceptual diagram related to measuring tilting of an arm 301 according to an embodiment of the present invention.

FIG. 3 is a conceptual diagram related to measuring the tilting of an arm 301.

Next, after determining the difference between L206 and L207, the arm 301 is inserted between the printed circuit board 103 and the guide panel 104.

Then, the tester disposes the distance measuring units 203 and 204 apart from each other by a predetermined distance D208 below a portion of the arm 301 protruding from the gap between the printed circuit board 103 and the guide panel 104.

The distance measuring units 203 and 204 measure their respective distances L302 and L303 from the arm 301. The controller 205 calculates the difference between the distances L302 and L303, and sends the calculated difference between the distances L302 and L303 to the arm-tilt correcting unit 1904. In the embodiment, the calculated difference that the controller 205 sends to the arm-tilt correcting unit 1904 is determined by subtracting the distance L303 from the distance L302 (L302–L303).

The distance measuring units 203 and 204 are disposed on the distance-measuring-unit securing plate 1501. The tilting of the distance-measuring-unit securing plate 1501 is fixed.

Figure 5:
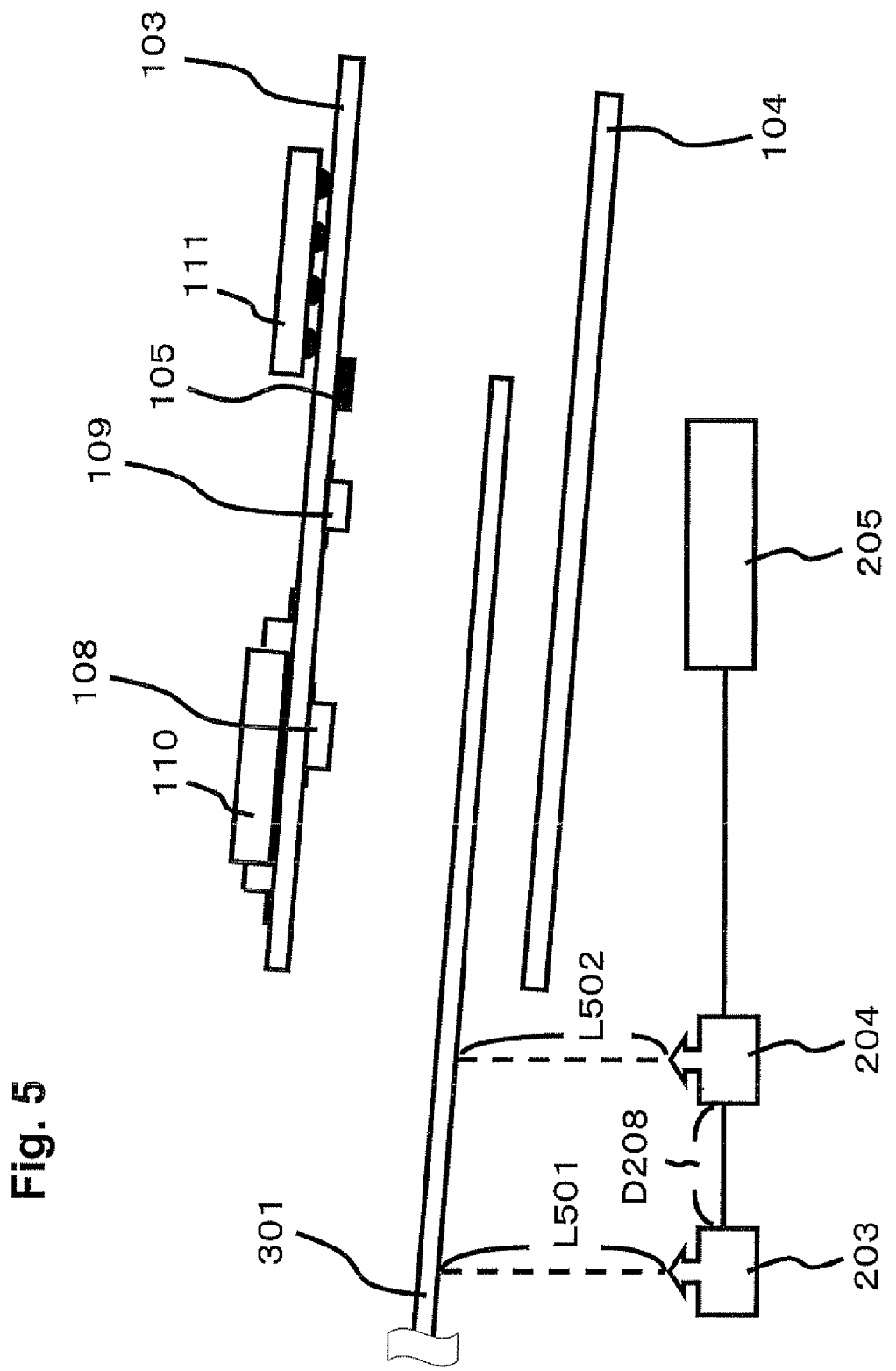
FIG. 5 is a conceptual diagram related to the measuring of the tilting of the arm 301 according to an embodiment of the present invention.

The tilting of the distance-measuring-unit securing plate 1501 when the distances L302 and L303 are measured is the same as that when the distances L206 and L207 are measured. When the distance-measuring-unit securing plate 1501 and the arm 301 are parallel to each other, the difference between the distances L302 and L303 (L302−L303) is zero. However, when the distance-measuring-unit securing plate 1501 and the arm 301 are not parallel to each other, in FIG. 5, L501−L502≠0. The tilting of the distance-measuring-unit securing plate 1501 when the distances L501 and L502 are measured is the same as that when the distances L401 and L402 are measured.

Figure 6:
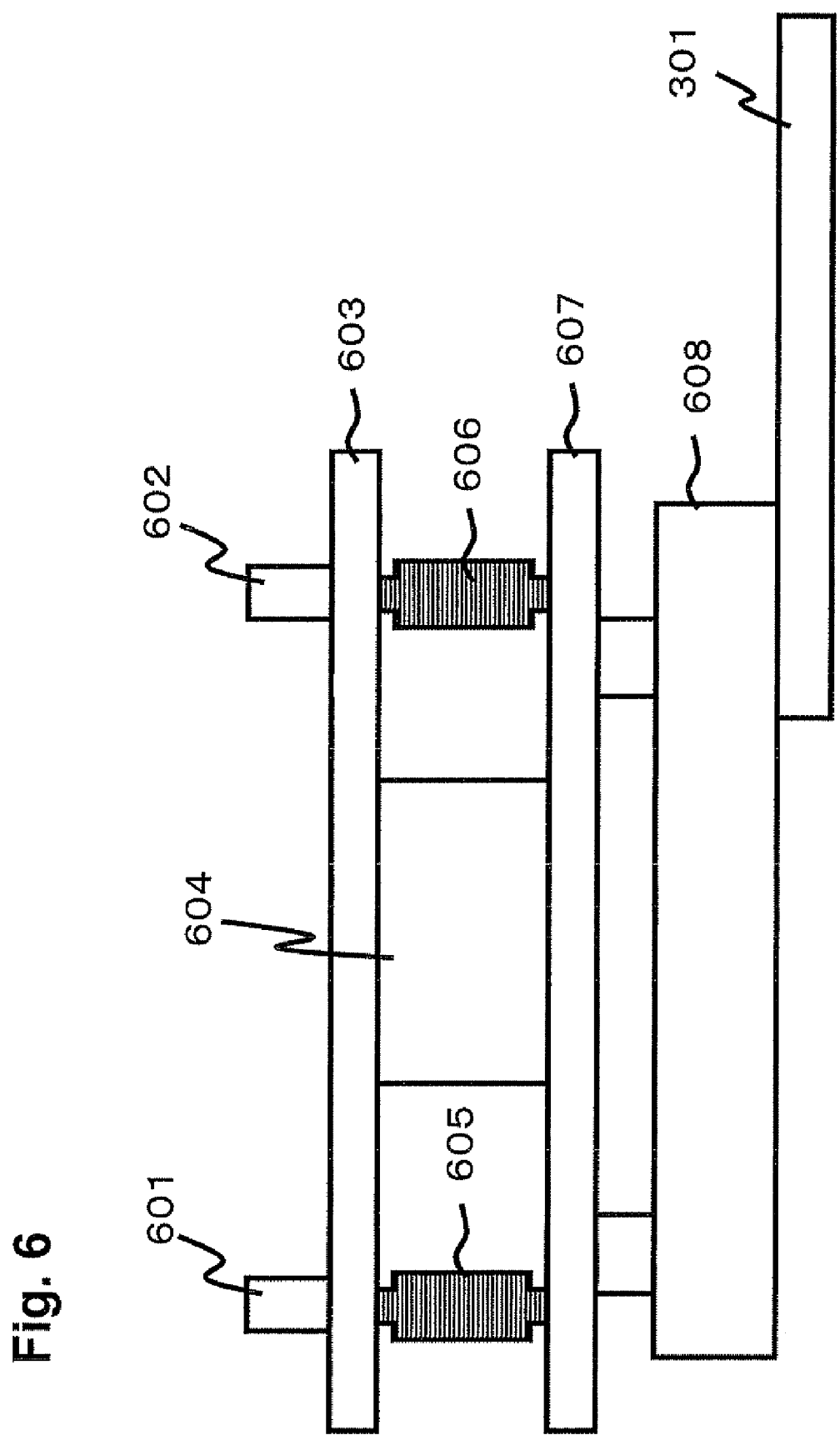
FIG. 6 is a schematic side view of arm disposing unit 1906 according to an embodiment of the present invention.
Figure 7:
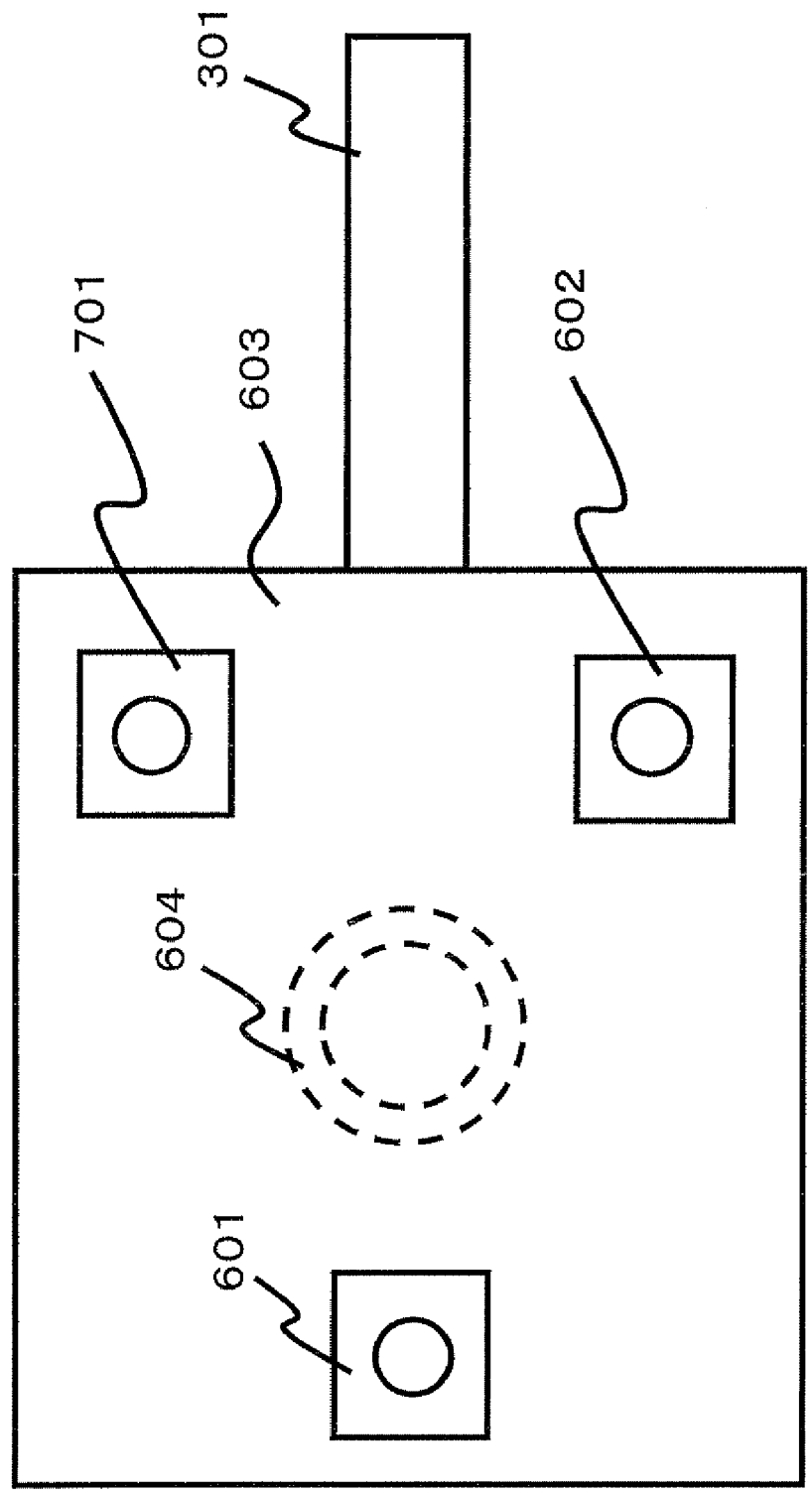
FIG. 7 is a schematic top view of the arm disposing unit 1906 according to an embodiment of the present invention.
Figure 8:
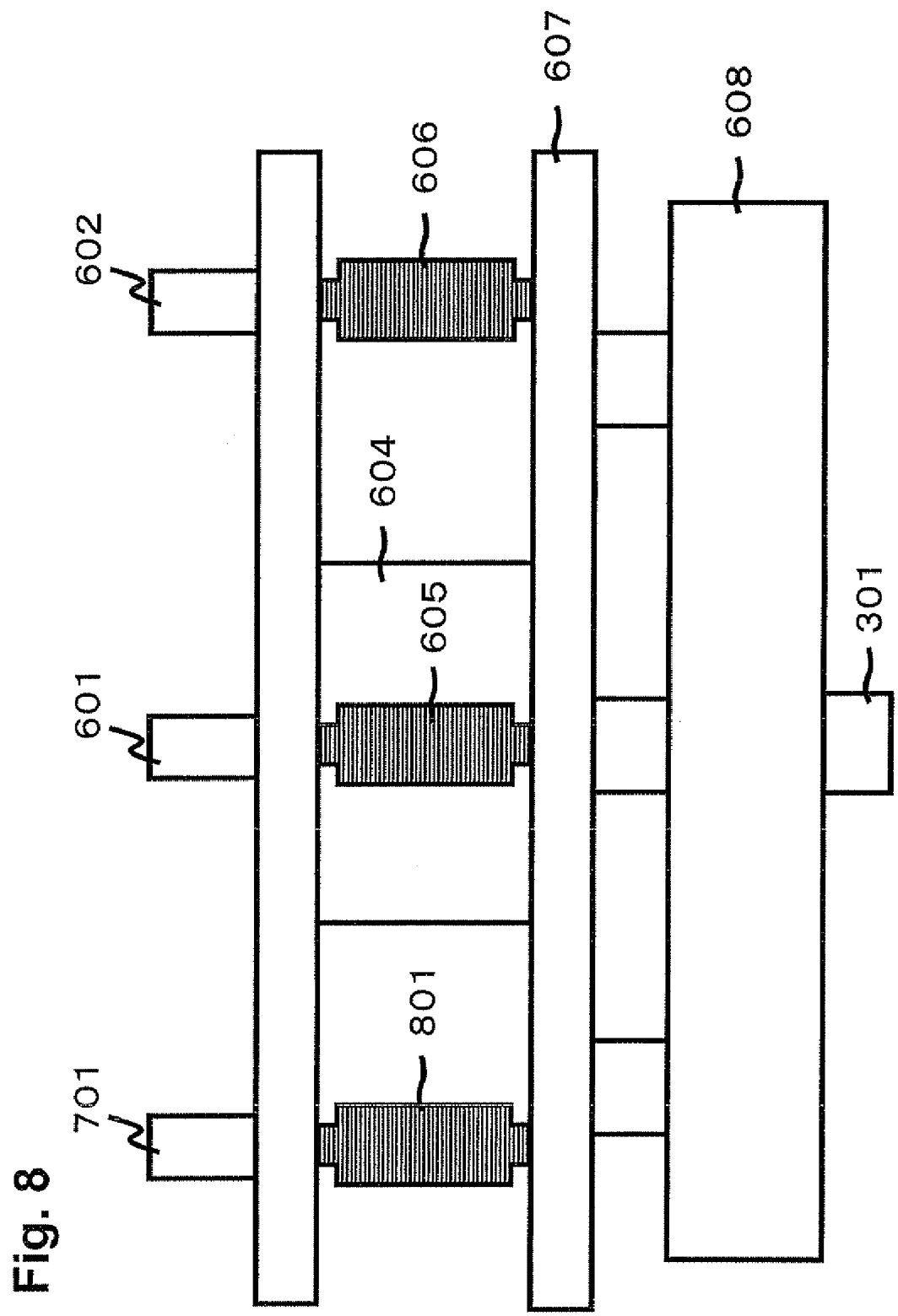
FIG. 8 is a schematic rear view of the arm disposing unit 1906 according to an embodiment of the present invention.

FIG. 6 is a schematic view related to a side of the arm-tilt correcting unit 1904 that corrects the tilting of the arm 301 to a predetermined tilting. FIG. 7 is a schematic view related to the top of the arm-tilt correcting unit 1904 that corrects the tilting of the arm 301 to a predetermined tilting. FIG. 8 is a schematic view related to the rear of the arm-tilt correcting unit 1904 that corrects the tilting of the arm 301 to a predetermined tilting.

Actuators 601, 602, and 701 are disposed on a reference plate 603, and vertically drive tilt adjusting units 605, 606, and 801. As shown in FIG. 7, the actuators 601, 602, and 701 are disposed on the reference plate 602 so as to define a triangle, with the actuators 601, 602, and 701 being the vertices of the triangle.

The actuators 601, 602, and 701 are connected to the operating unit 901 shown in FIG. 9. The tester can operate the actuators 601, 602, and 701 with the operating unit 901.

A tilt adjusting stage 604 is connected to the reference plate 603 and the tilt adjusting unit 607, and the tilting of the tilt adjusting plate 607 that is adjusted is maintained by three supports, the tilt adjusting units 605, 606, and 801.

An arm controller 608 controls, for example, the pushing out of the probe (not shown) provided at the arm 301, when the printed circuit board is to be tested, and is secured to the tilt adjusting plate 607.

The arm 301 is secured to the probe controller 608. When the tilt adjusting plate 607 is tilted, the arm 301 is also tilted and is moved. The operating unit 901 is operated while monitoring the tilting of the arm 301, and the actuators 601, 602, and 701 vertically drive the tilt adjusting units 605, 606, and 801, respectively.

FIG. 9 is a schematic view of the operating unit 901.

Figure 10:
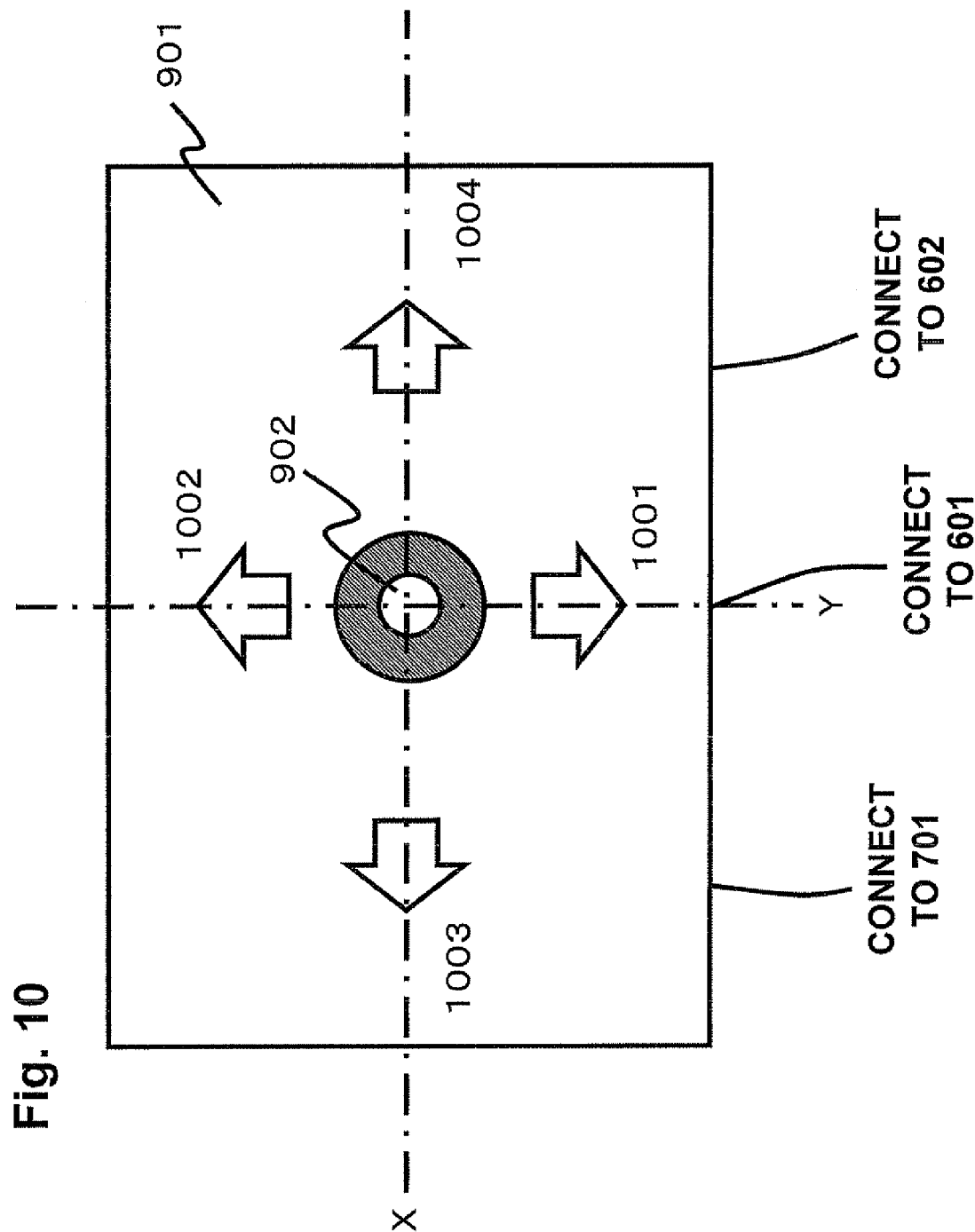
FIG. 10 is a schematic top view of the operating unit 901 according to an embodiment of the present invention.

FIG. 10 is a schematic top view of the operating unit 901.

A joystick 902 is disposed at the operating unit 901. The tester can move the joystick 902 in an X-axis direction and a Y-axis direction.

Figure 11:
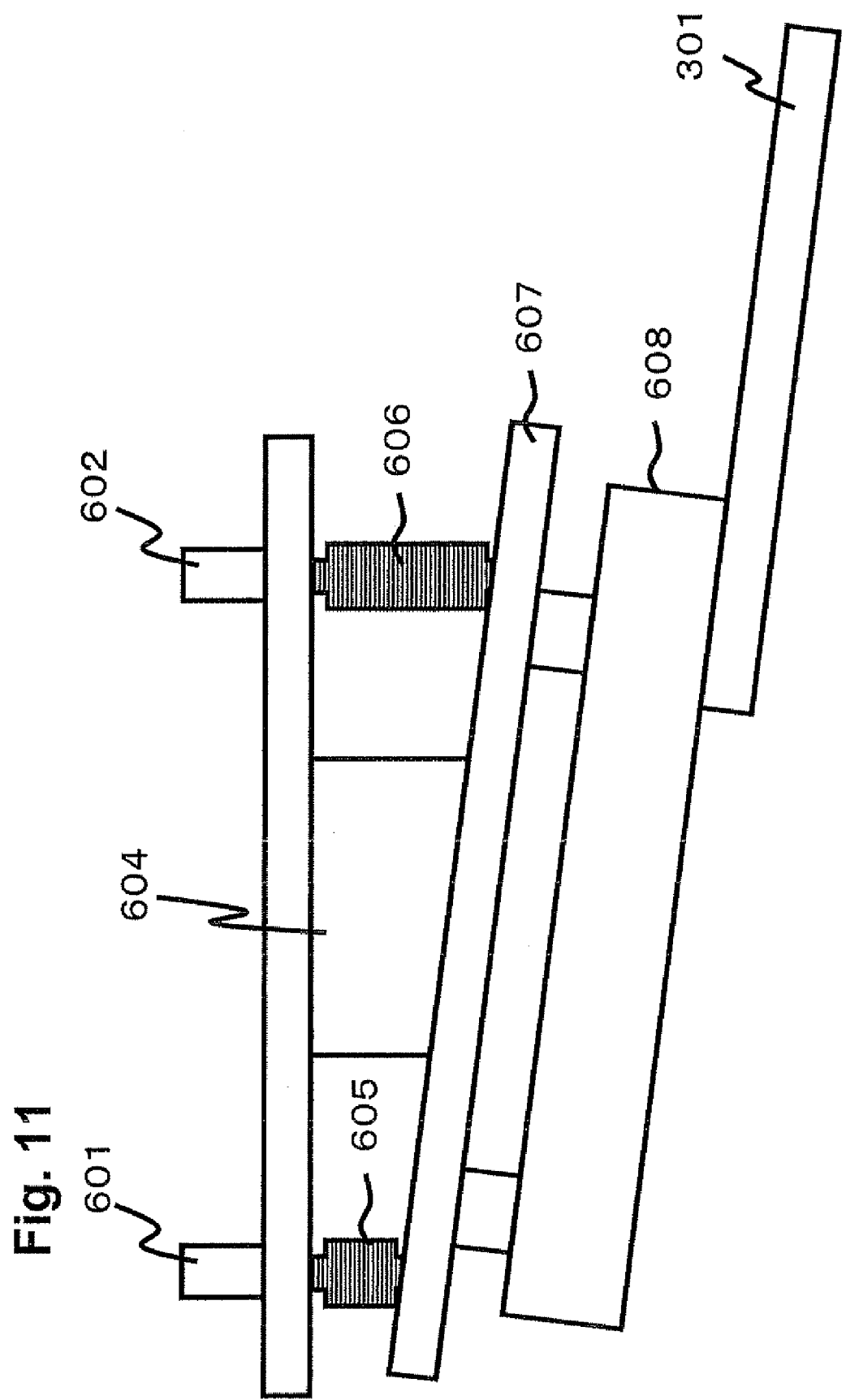
FIG. 11 is a schematic view of arm-tilt correcting unit 1904 when a joystick 902 is operated in the direction of arrow 1001 according to an embodiment of the present invention.
Figure 12:
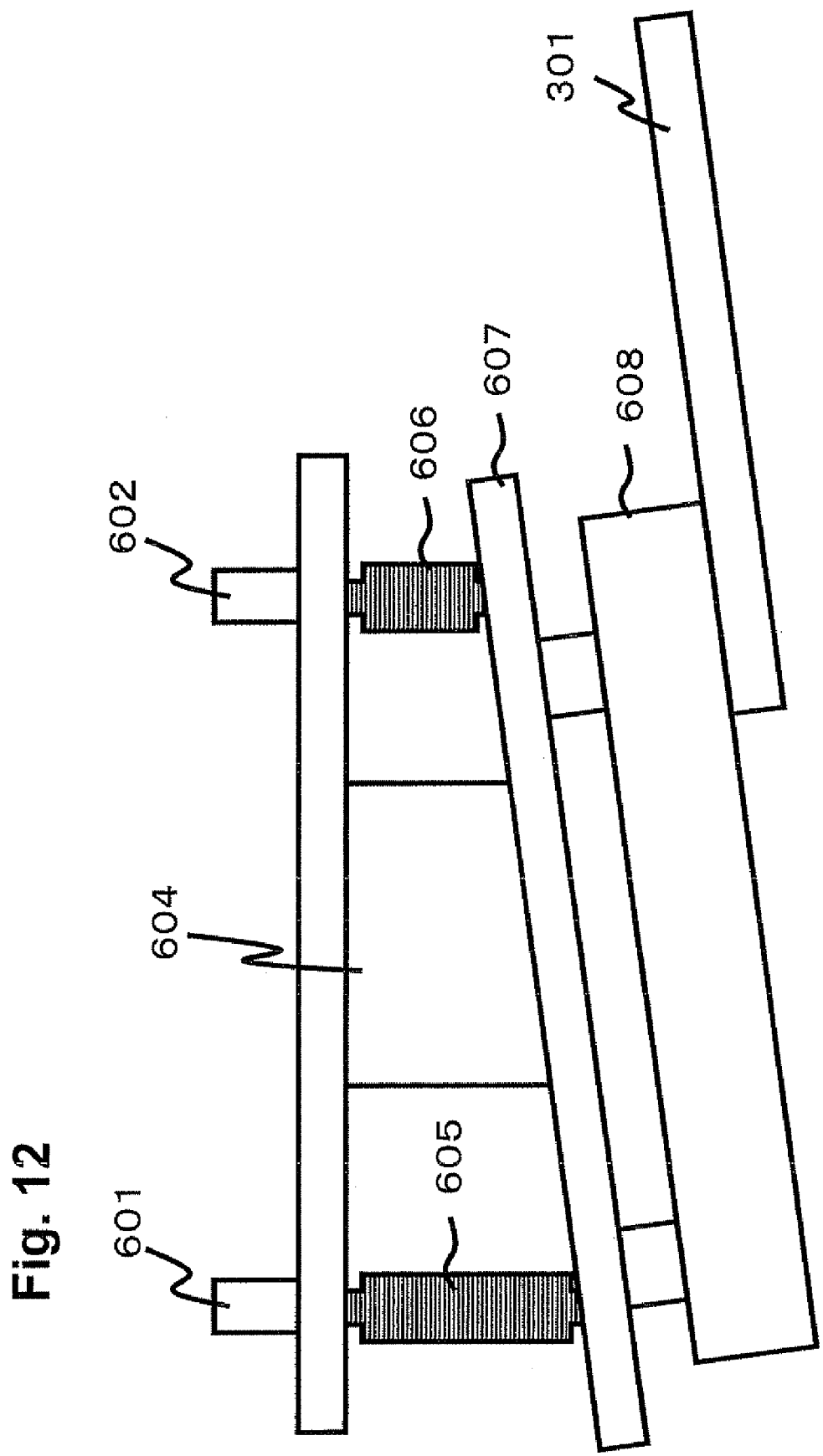
FIG. 12 is a schematic view of the arm-tilt correcting unit 1904 when the joystick 902 is operated in the direction of arrow 1002 according to an embodiment of the present invention.
Figure 13:
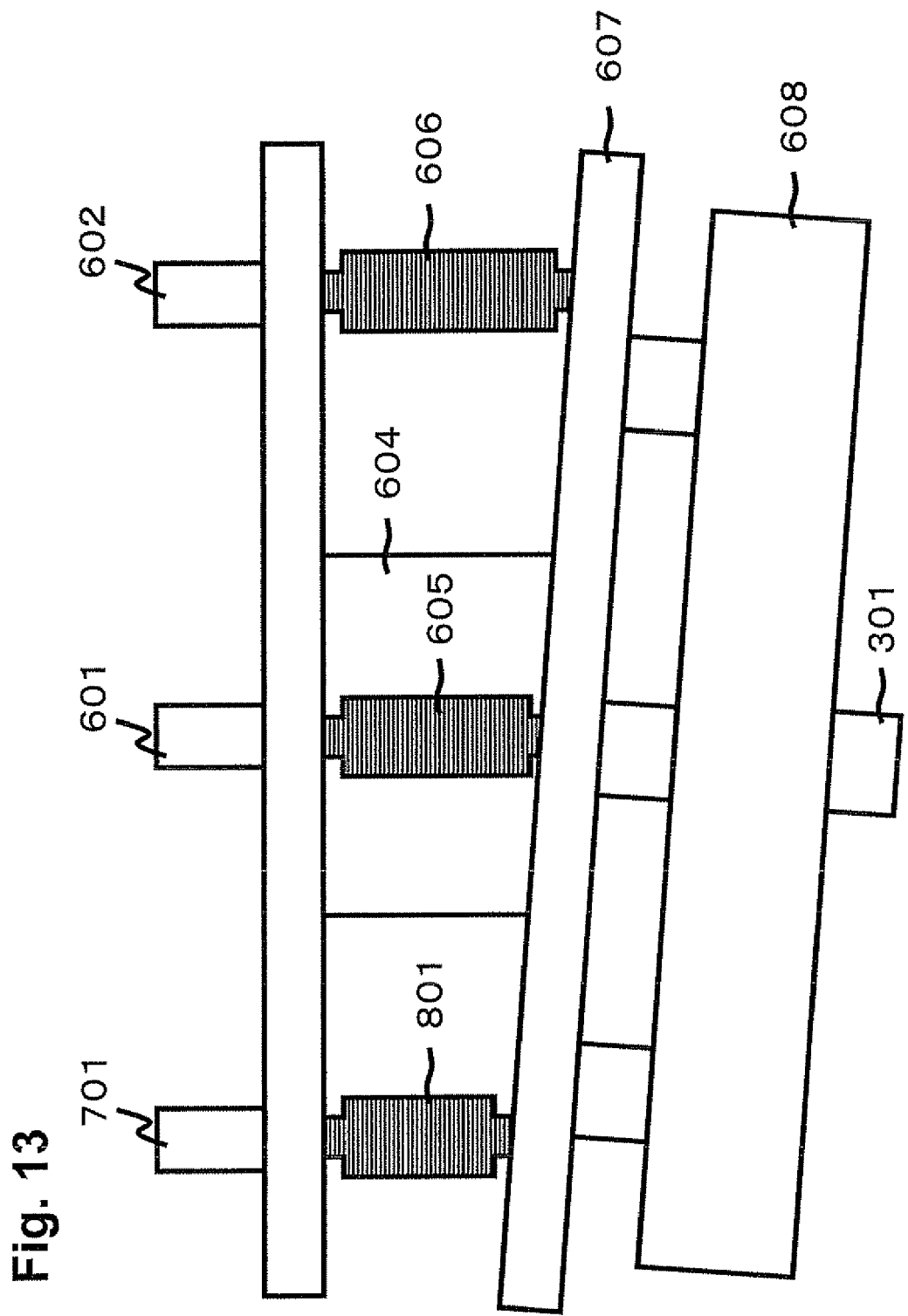
FIG. 13 is a schematic view of the arm-tilt correcting unit 1904 when the joystick 902 is operated in the direction of arrow 1003 according to an embodiment of the present invention.
Figure 14:
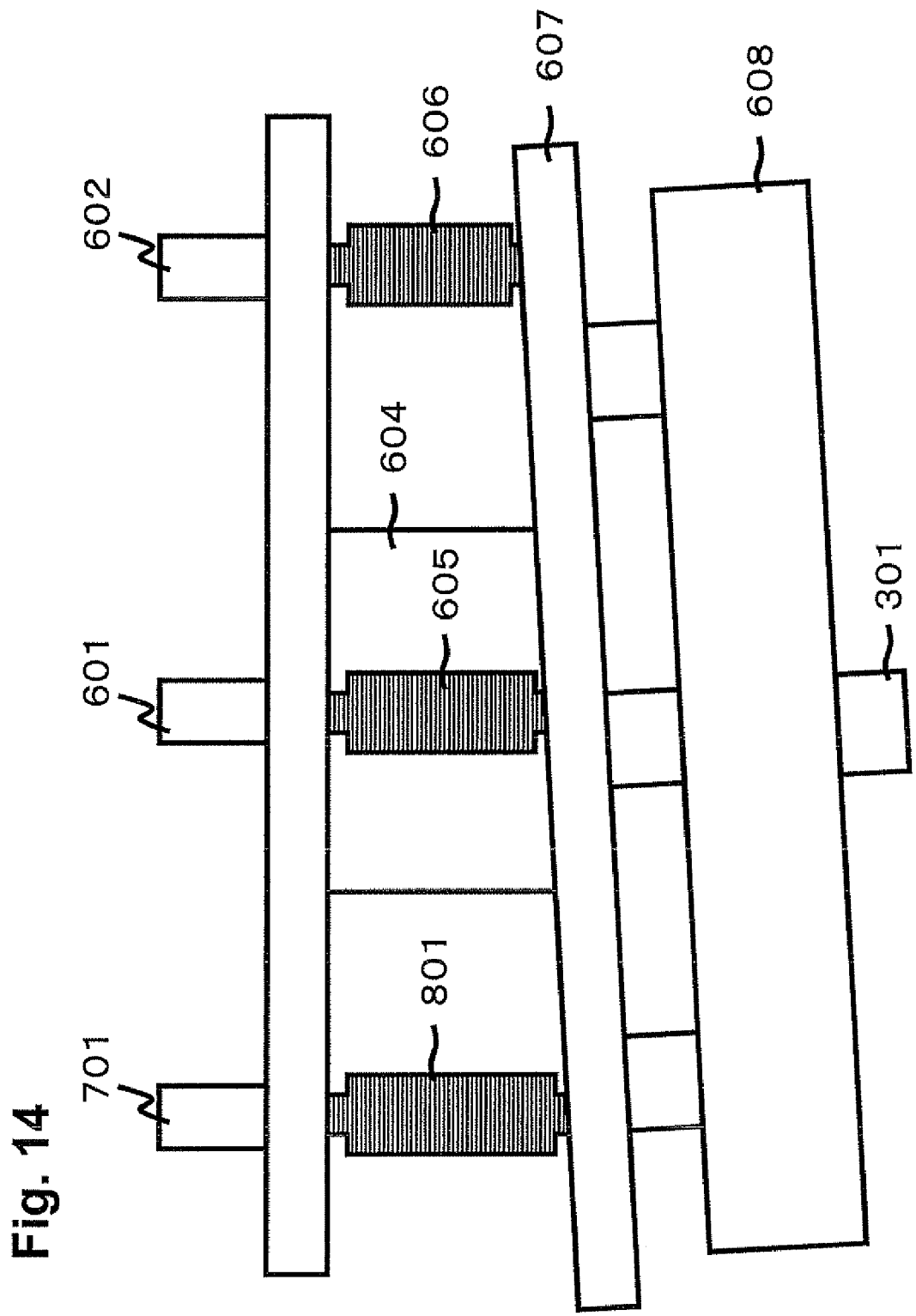
FIG. 14 is a schematic view of the arm-tilt correcting unit 1904 when the joystick 902 is operated in the direction of arrow 1004 according to an embodiment of the present invention.

In the case where the arm-tilt correcting unit 1904 is in the state shown in FIG. 6, when the tester operates the joystick 902 in the direction of arrow 1001 shown in FIG. 10, the arm-tilt correcting unit 1904 causes the arm 301 to be disposed as shown in FIG. 11. Similarly, in the case where the arm-tilt correcting unit 1904 is in the state shown in FIG. 6, when the tester operates the joystick 902 in the direction of arrow 1002 shown in FIG. 10, the arm-tilt correcting unit 1904 causes the arm 301 to be disposed as shown in FIG. 12. Similarly, in the case where the arm-tilt correcting unit 1904 is in the state shown in FIG. 6, when the tester operates the joystick 902 in the direction of arrow 1003 shown in FIG. 10, the arm-tilt correcting unit 1904 causes the arm 301 to be disposed as shown in FIG. 13. Similarly, in the case where the arm-tilt correcting unit 1904 is in the state shown in FIG. 6, when the tester operates the joystick 902 in the direction of arrow 1004 shown in FIG. 10, the arm-tilt correcting unit 1904 causes the arm 301 to be disposed as shown in FIG. 14.

FIG. 11 is a schematic view related to the arm-tilt correcting unit 1904 when the joystick 902 is operated in the direction of arrow 1001.

When the tester operates the joystick 902 in the direction of arrow 1001 shown in FIG. 10, the actuator 601 connected to the operating unit 901 drives the tilt adjusting unit 605 upward, and the actuators 602 and 701 drive the respective tilt adjusting units 606 and 801 downwards. In the embodiment, when the joystick 902 is operated in the direction of arrow 1001, the actuators 602 and 701 drive the respective tilt adjusting units 606 and 801 downward through the same distance.

FIG. 12 is a schematic view related to the arm-tilt correcting unit 1904 when the joystick 902 is operated in the direction of arrow 1002.

When the tester operates the joystick 902 in the direction of arrow 1002 shown in FIG. 10, the actuator 601 connected to the operating unit 901 drives the tilt adjusting unit 605 downward, and the actuators 602 and 701 drive the respective tilt adjusting units 606 and 801 upwards. In the embodiment, when the joystick 902 is operated in the direction of arrow 1002, the actuators 602 and 701 drive the respective tilt adjusting units 606 and 801 upward through the same distance.

FIG. 13 is a schematic view related to the arm-tilt correcting unit 1904 when the joystick 902 is operated in the direction of arrow 1003.

When the tester operates the joystick 902 in the direction of arrow 1003 shown in FIG. 10, the actuator 601 connected to the operating unit 901 does not drive the tilt adjusting unit 605 so that the tilt adjusting unit 605 remains where it is, the actuator 602 drives the tilt adjusting unit 606 downwards, and the actuator 701 drives the tilt adjusting unit 801 upwards.

FIG. 14 is a schematic view related to the arm-tilt correcting unit 1904 when the joystick 902 is operated in the direction of arrow 1004.

When the tester operates the joystick 902 in the direction of arrow 1004 shown in FIG. 10, the actuator 601 connected to the operating unit 901 does not drive the tilt adjusting unit 605 so that the tilt adjusting unit 605 remains where it is, the actuator 602 drives the tilt adjusting unit 606 upwards, and the actuator 701 drives the tilt adjusting unit 801 downwards.

FIG. 15 is a schematic view of a tilt measuring device 1500.

As mentioned above, in the embodiment, the printed-circuit-board-tilt measuring unit 1902 and the arm-tilt measuring unit 1903 are the same in terms of hardware. Therefore, the term "tilt measuring device 1500" will be used as a generic term for the printed-circuit-board-tilt measuring unit 1902 and the arm-tilt measuring unit 1903.

The distance measuring units 203 and 204 are separated from each other by a distance D and disposed on the distance-measuring-unit securing plate 1501. The distance D is changeable to a predetermined distance.

The distance-measuring-unit securing plate 1501 is connected to a rotary stage 1502, and can be rotated through an angle of 360 degrees, with the direction of lamination of the distance-measuring-unit securing plate 1501 and the rotary stage 1502 being defined as an axial direction.

Figure 16:
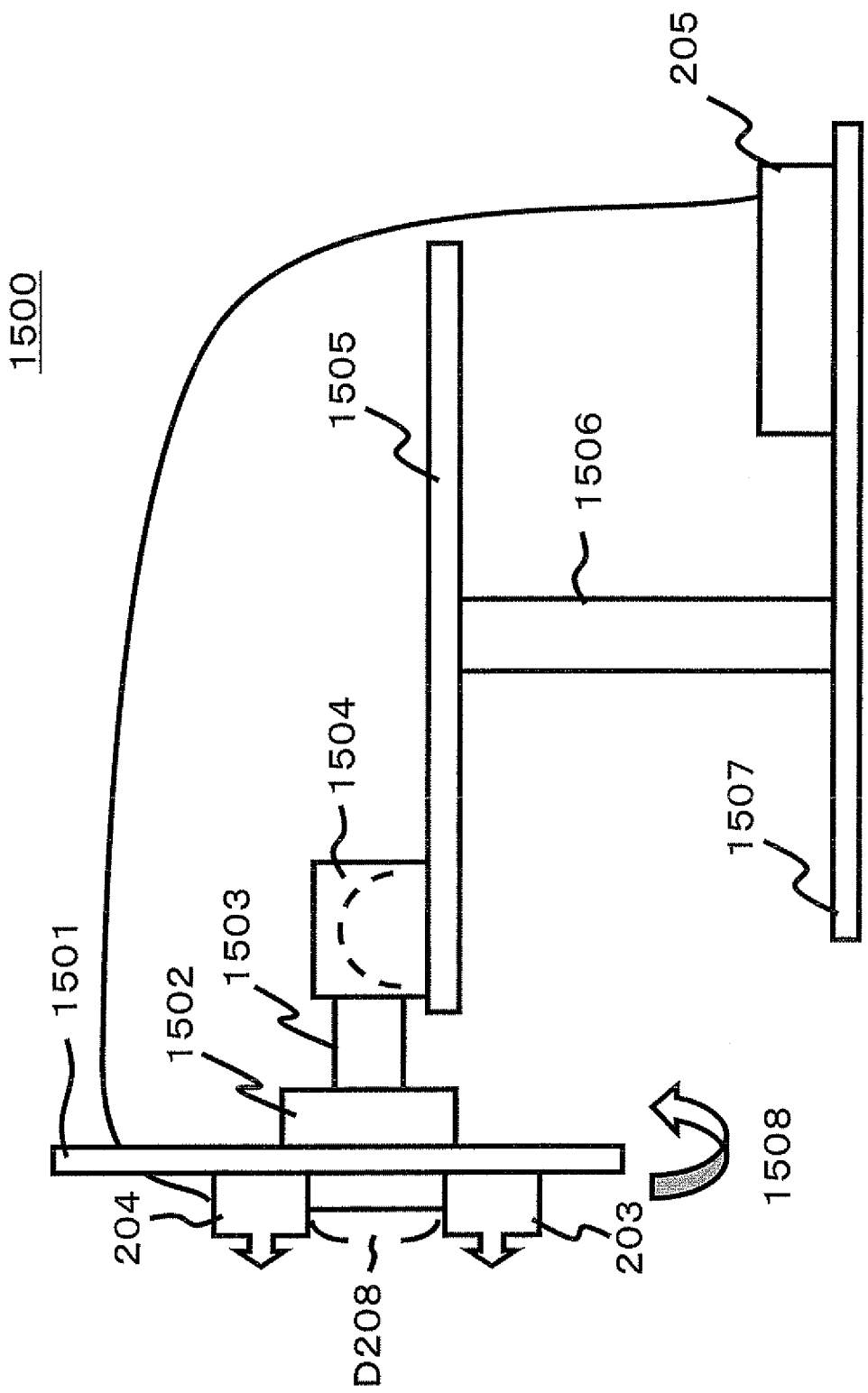
FIG. 16 is a schematic view of the tilt measuring device 1500 according to an embodiment of the present invention.

A shaft 1503 connected to a half-turning unit 1504 is connected to a surface of the rotary stage 1502 that is opposite to the surface of the rotary stage 1502 to which the distance-measuring-unit securing plate 1501 is secured. The half-turning unit 1504 can be rotated through an angle of 180 degrees. When the half-turning unit 1504 rotates through an angle of 90 degrees in the direction of arrow 1508, the form of the tilt measuring device 1500 is changed as shown in FIG. 16.

Figure 17:
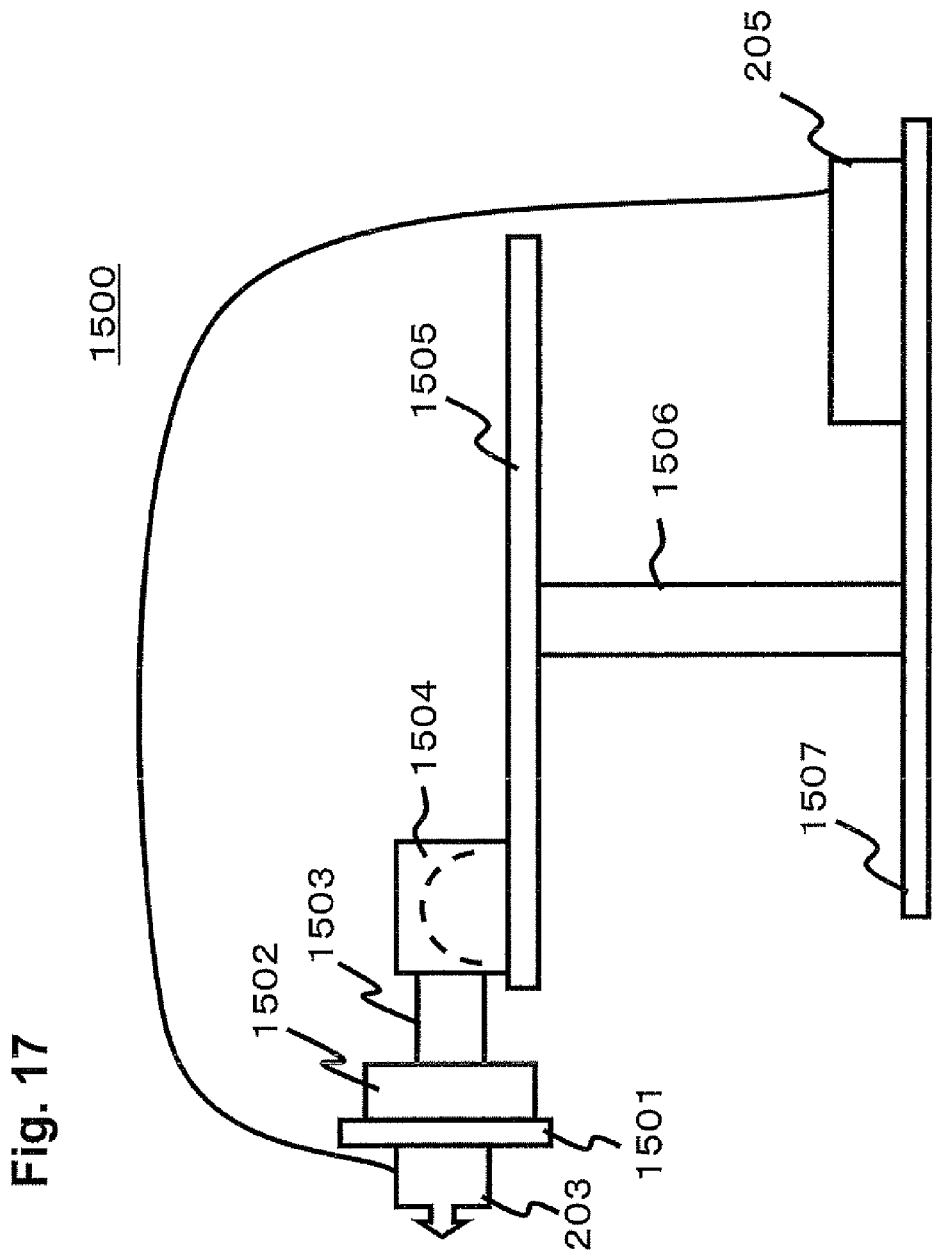
FIG. 17 is a schematic view of the tilt measuring device 1500 according to an embodiment of the present invention.

The half-turning unit 1504 is secured on a stage 1505. A shaft 1506 is secured to a surface of the stage 1505 that is opposite to the surface 1505 to which the half-turning unit 1504 is secured, and is connected to a stage 1507. The controller 205 is disposed on the stage 1507. In the tilt measuring device 1500 having the form shown in FIG. 16, when the rotary stage 1502 is rotated through an angle of 90 degrees in the direction of arrow 1601, the form of the tilt measuring device 1500 is changed as shown in FIG. 17.

Figure 18:
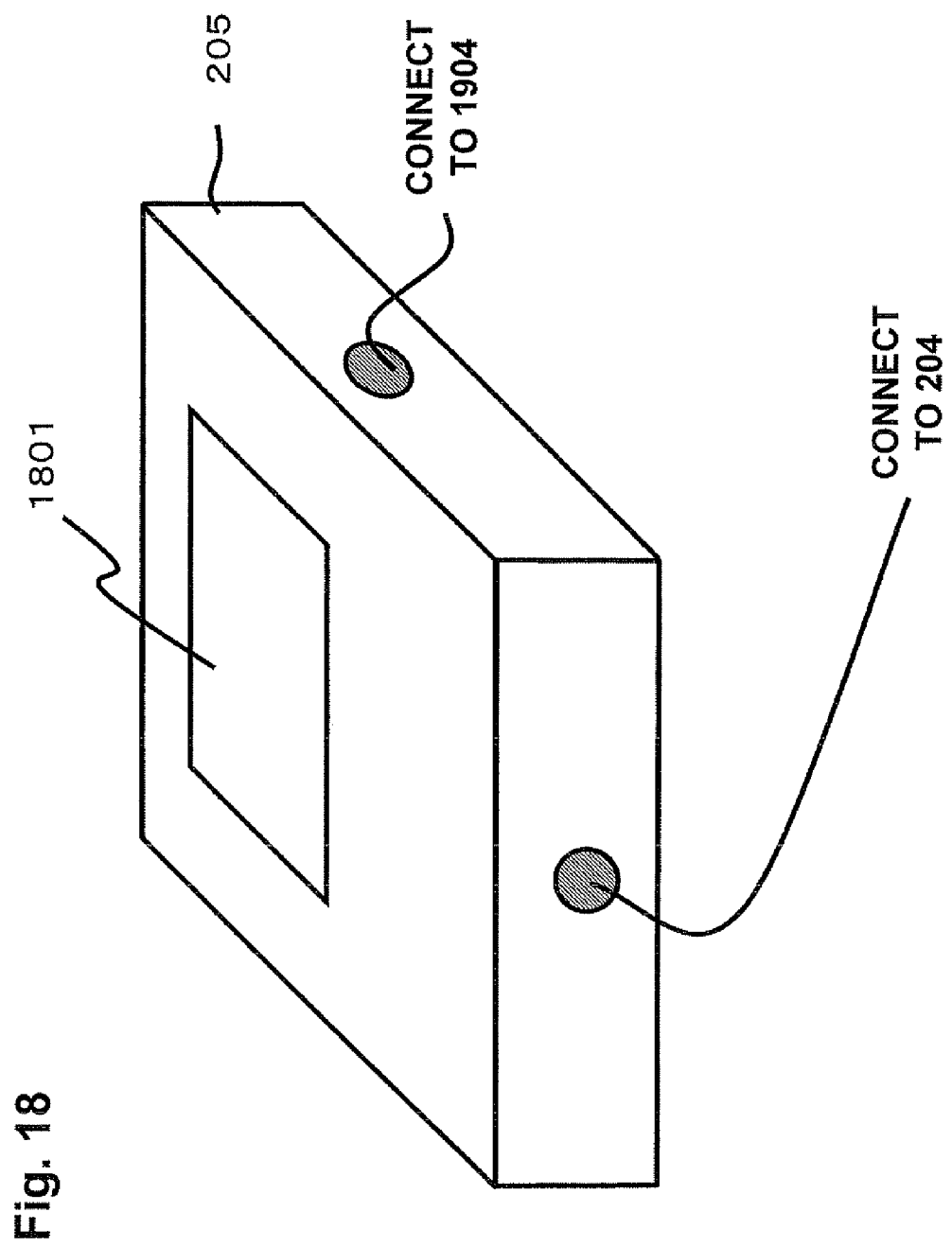
FIG. 18 is a schematic view of a controller 205 according to an embodiment of the present invention.

FIG. 18 is a schematic view of the controller 205.

The controller 205 is provided with a display unit 1801. The display unit 1801 displays the difference between the distance measured by the distance measuring unit 203 and the distance measured by the distance measuring unit 204. The controller 205 is connected to the arm-tilt correcting unit 1904, and sends the calculated tilt information of the printed circuit board and the calculated tilt information of the arm to the arm-tilt correcting unit 1904.

Figure 20:
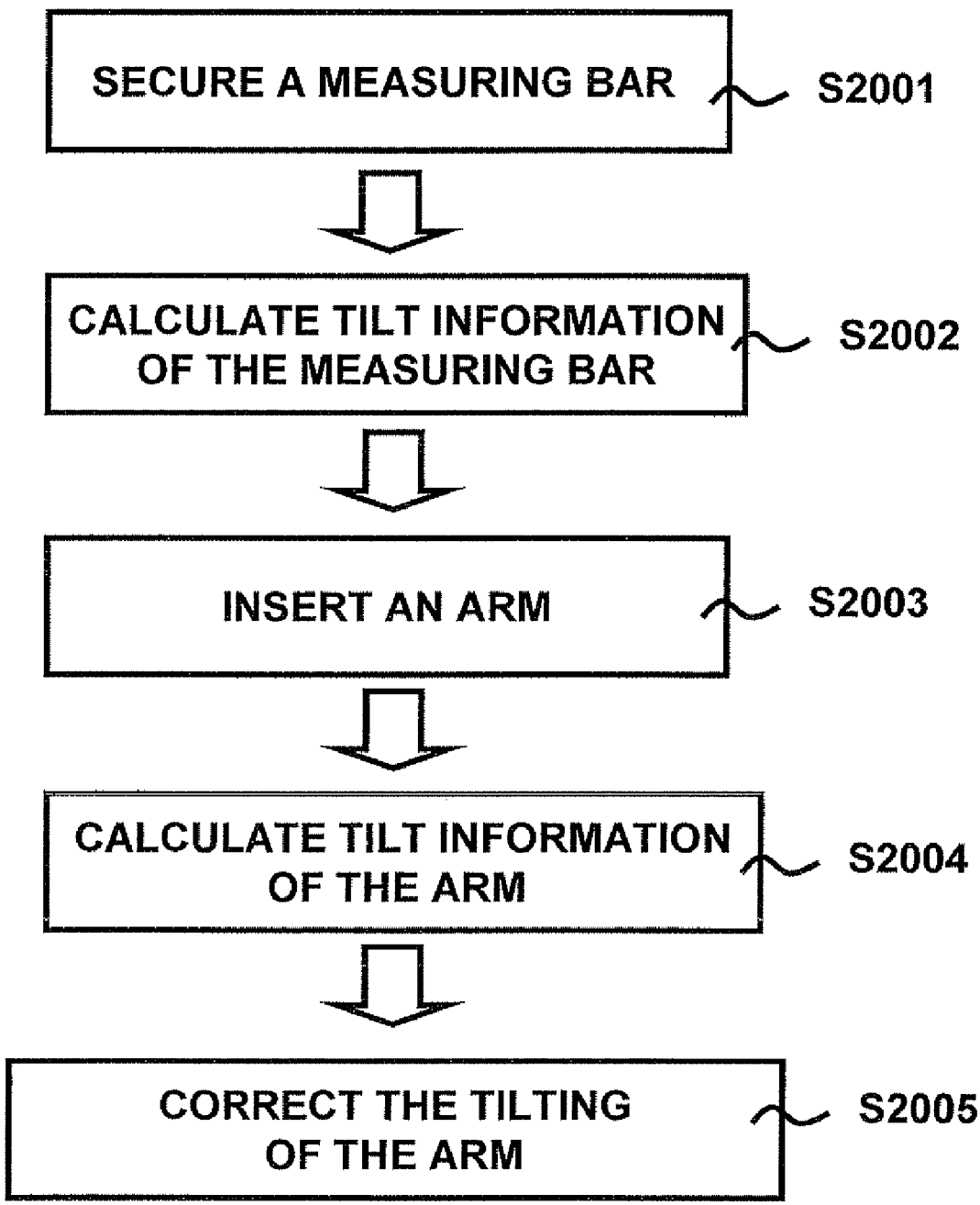
FIG. 20 is a flowchart of the steps of correcting tilting of an arm according to an embodiment of the present invention.

FIG. 20 is a flowchart of the steps of correcting tilting of the arm according to an embodiment.

First, the tester secures the measuring bar that is parallel to and that is disposed below the printed circuit board to the guide panel (Step S2001). The measuring bar is disposed so as to contact the surface of the guide panel that faces the printed circuit board 103 and so as to protrude from the gap between the printed circuit board and the guide panel 104.

Using the tilt measuring device 1500, the distance between one point of the measuring bar and the distance measuring unit 203 and the distance between another point of the measuring bar and the distance measuring unit 204 are measured to calculate tilt information of the measuring bar (Step S2002). The guide panel and the printed circuit board are substantially parallel to each other, so that the calculated tilt information of the measuring bar is regarded as tilt information of the printed circuit board.

After determining the tilt of the printed circuit board, the tester removes the measuring bar from the guide panel. After removing the measuring bar, the tester inserts the arm between the printed circuit board and the guide panel (Step S2003).

Using the tilt measuring device 1500, the distance between one point of the arm and the distance measuring unit 203 and the distance between another point of the arm and the distance measuring unit 204 are measured to calculate tilt information of the arm (Step S2004).

The tilt information of the arm and the tilt information of the printed circuit board are stored in the arm-tilt correcting unit 1904. The arm-tilt correcting unit 1904 refers to the tilt information of the printed circuit board and the tilt information of the arm to correct the tilting of the arm (Step S2005).

The technical ideas of the printed-circuit-board testing device according to the above-described embodiment will be enumerated in the form of claims and as claims. The technical ideas according to the present invention may be understood in various levels and in many variations, on the basis of from broad concepts to narrow concepts. Therefore, the present invention is not limited to the following appendices.

What is claimed is:

1. A testing method for probing a printed circuit board, the testing method comprising the steps of:
   measuring tilting angle of the printed circuit board;
   measuring tilting angle of an arm having a probe for contacting with the printed circuit board;
   correcting the tilting angle of the arm on the basis of the tilting angle of the printed circuit board and the tilting angle of the arm, for disposing the arm to a predetermined position; and
   probing the printed circuit board by contacting with the probe of the arm.

2. A computer-readable recording medium that stores a computer program for probing a printed circuit board by controlling a testing device according to a process comprising:
   measuring tilting angle of the printed circuit board;
   measuring tilting angle of an arm having a probe for contacting with the printed circuit board;
   correcting the tilting angle of the arm on the basis of the tilting angle of the printed circuit board and the tilting angle of the arm, for disposing the arm to a predetermined position; and
   probing the printed circuit board by contacting with the probe of the arm.

* * * * *